United States Patent
Englekirk

(10) Patent No.: US 9,413,362 B2
(45) Date of Patent: Aug. 9, 2016

(54) DIFFERENTIAL CHARGE PUMP

(71) Applicant: PEREGRINE SEMICONDUCTOR CORPORATION, San Diego, CA (US)

(72) Inventor: Robert Mark Englekirk, Pacific Palisades, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 13/932,996

(22) Filed: Jul. 1, 2013

(65) Prior Publication Data

US 2015/0002214 A1    Jan. 1, 2015

(51) Int. Cl.
*G05F 1/10* (2006.01)
*H03L 7/089* (2006.01)
*H02M 3/07* (2006.01)
*H02M 1/00* (2006.01)

(52) U.S. Cl.
CPC .............. *H03L 7/0891* (2013.01); *H02M 3/07* (2013.01); *H02M 3/073* (2013.01); *H02M 2001/0032* (2013.01); *Y02B 70/16* (2013.01)

(58) Field of Classification Search
CPC ......... H02M 3/07; H02M 3/073; H02M 3/00; H02M 1/14
USPC ........... 327/536, 537; 363/59–61; 365/189.09
See application file for complete search history.

(56) References Cited

U.S. PATENT DOCUMENTS

| | | | |
|---|---|---|---|
| 3,469,212 A | 9/1969 | Karl et al. |
| 3,470,443 A | 9/1969 | Berry et al. |
| 3,646,361 A | 2/1972 | Pfiffner |
| 3,731,112 A | 5/1973 | Smith |
| 3,878,450 A | 4/1975 | Greatbatch |
| 3,942,047 A | 3/1976 | Buchanan |
| 3,943,428 A | 3/1976 | Whidden |

(Continued)

FOREIGN PATENT DOCUMENTS

| | | |
|---|---|---|
| DE | 102005039138 A1 | 2/2007 |
| EP | 385641 | 9/1990 |

(Continued)

OTHER PUBLICATIONS

Young, Lee W., International Search Report received from the USRO dated Mar. 14, 2011 for related appln. No. PCT/US2009/04149, 25 pgs.

(Continued)

*Primary Examiner* — Lincoln Donovan
*Assistant Examiner* — Thomas Skibinski
(74) *Attorney, Agent, or Firm* — Jaquez Land Greenhaus LLP; Martin J. Jaquez, Esq.; John Land, Esq.

(57) ABSTRACT

A DC-to-DC voltage converter comprising a differential charge pump that utilizes a differential clocking scheme to reduce output electrical noise by partial cancellation of charge pump glitches (voltage transients), and a corresponding method of operating a differential charge pump. The differential charge pump can be characterized as having at least two charge pump sections that initiate charge pumping in opposite phases of a clock signal to transfer (pump) charge to storage capacitors. The differential charge pump is particularly well suited for implementation in integrated circuit chips requiring negative and/or positive voltages, and multiples of such voltages, based on a single input voltage.

24 Claims, 5 Drawing Sheets

(56) References Cited

U.S. PATENT DOCUMENTS

| | | | |
|---|---|---|---|
| 3,955,353 A | 5/1976 | Astle |
| 3,975,671 A | 8/1976 | Stoll |
| 3,995,228 A | 11/1976 | Pass |
| 4,047,091 A | 9/1977 | Hutchines et al. |
| 4,061,929 A | 12/1977 | Asano |
| 4,068,295 A | 1/1978 | Portmann |
| 4,106,086 A | 8/1978 | Holbrook et al. |
| 4,158,182 A | 6/1979 | Washburn |
| 4,186,436 A | 1/1980 | Ishiwatari |
| 4,316,101 A | 2/1982 | Minner |
| 4,321,661 A | 3/1982 | Sano |
| 4,344,050 A * | 8/1982 | Callahan ............... 333/173 |
| 4,374,357 A | 2/1983 | Olesin et al. |
| 4,388,537 A | 6/1983 | Kanuma |
| 4,390,798 A | 6/1983 | Kurafuji |
| 4,460,952 A | 7/1984 | Risinger |
| RE31,749 E | 11/1984 | Yamashiro |
| 4,485,433 A | 11/1984 | Topich |
| 4,528,517 A | 7/1985 | Schlotzhauer |
| 4,575,644 A | 3/1986 | Leslie |
| 4,621,315 A | 11/1986 | Vaughn et al. |
| 4,633,106 A | 12/1986 | Backes et al. |
| 4,638,184 A | 1/1987 | Kimura |
| 4,679,134 A | 7/1987 | Bingham et al. |
| 4,703,196 A | 10/1987 | Arakawa |
| 4,736,169 A | 4/1988 | Weaver et al. |
| 4,739,191 A | 4/1988 | Puar |
| 4,746,960 A | 5/1988 | Valeri et al. |
| 4,752,699 A | 6/1988 | Cranford, Jr. et al. |
| 4,769,784 A | 9/1988 | Doluca et al. |
| 4,777,577 A | 10/1988 | Bingham et al. |
| 4,839,787 A | 6/1989 | Kojima et al. |
| 4,847,519 A | 7/1989 | Wahl et al. |
| 4,891,609 A | 1/1990 | Eilley |
| 4,897,774 A | 1/1990 | Bingham et al. |
| 5,023,465 A | 6/1991 | Douglas et al. |
| 5,023,494 A | 6/1991 | Tsukii et al. |
| 5,029,282 A | 7/1991 | Ito |
| 5,032,799 A | 7/1991 | Milberger et al. |
| 5,036,229 A * | 7/1991 | Tran ............... H02M 3/073 307/110 |
| 5,038,325 A | 8/1991 | Douglas et al. |
| 5,061,907 A | 10/1991 | Rasmussen |
| 5,068,626 A | 11/1991 | Takagi et al. |
| 5,075,572 A | 12/1991 | Poteet et al. |
| 5,081,371 A | 1/1992 | Wong |
| 5,111,375 A | 5/1992 | Marshall |
| 5,124,571 A | 6/1992 | Gillingham et al. |
| 5,126,590 A | 6/1992 | Chern |
| 5,138,190 A | 8/1992 | Yamazaki et al. |
| 5,146,178 A | 9/1992 | Nojima et al. |
| 5,180,928 A | 1/1993 | Choi |
| 5,182,529 A | 1/1993 | Chern |
| 5,193,198 A | 3/1993 | Yokouchi |
| 5,196,996 A | 3/1993 | Oh |
| 5,208,557 A | 5/1993 | Kersh, III |
| 5,212,456 A | 5/1993 | Kovalcik et al. |
| 5,216,588 A | 6/1993 | Bajwa et al. |
| 5,274,343 A | 12/1993 | Russell et al. |
| 5,289,137 A | 2/1994 | Nodar et al. |
| 5,306,954 A | 4/1994 | Chan et al. |
| 5,317,181 A | 5/1994 | Tyson |
| 5,331,221 A | 7/1994 | Ganesan et al. |
| 5,392,186 A | 2/1995 | Alexander et al. |
| 5,392,205 A | 2/1995 | Zavaleta |
| 5,394,372 A | 2/1995 | Tanaka et al. |
| 5,408,140 A | 4/1995 | Kawai et al. |
| 5,418,499 A | 5/1995 | Nakao |
| 5,422,586 A | 6/1995 | Tedrow et al. |
| 5,446,418 A | 8/1995 | Hara et al. |
| 5,455,794 A | 10/1995 | Javanifard et al. |
| 5,465,061 A | 11/1995 | Dufour |
| 5,483,195 A | 1/1996 | Brown |
| 5,493,249 A | 2/1996 | Manning |
| 5,519,360 A | 5/1996 | Keeth |
| 5,528,245 A | 6/1996 | Aker et al. |
| 5,535,160 A | 7/1996 | Yamaguchi |
| 5,553,021 A | 9/1996 | Kubono et al. |
| 5,554,892 A | 9/1996 | Norimatsu |
| 5,589,793 A | 12/1996 | Kassapian |
| 5,600,281 A | 2/1997 | Mori et al. |
| 5,670,907 A | 9/1997 | Gorecki et al. |
| 5,672,992 A | 9/1997 | Nadd |
| 5,677,649 A | 10/1997 | Martin |
| 5,677,650 A | 10/1997 | Kwasniewski et al. |
| 5,689,213 A | 11/1997 | Sher |
| 5,694,308 A | 12/1997 | Cave |
| 5,698,877 A | 12/1997 | Gonzalez |
| 5,729,039 A | 3/1998 | Beyer et al. |
| 5,734,291 A | 3/1998 | Tasdighi et al. |
| 5,757,170 A | 5/1998 | Pinney |
| 5,786,617 A | 7/1998 | Merrill et al. |
| 5,793,246 A | 8/1998 | Vest et al. |
| 5,808,505 A | 9/1998 | Tsukada |
| 5,812,939 A | 9/1998 | Kohama |
| 5,818,289 A | 10/1998 | Chevallier et al. |
| 5,818,766 A | 10/1998 | Song |
| 5,864,328 A | 1/1999 | Kajimoto |
| 5,874,849 A | 2/1999 | Marotta et al. |
| 5,878,331 A | 3/1999 | Yamamoto et al. |
| 5,889,428 A | 3/1999 | Young |
| 5,892,400 A | 4/1999 | van Saders et al. |
| 5,917,362 A | 6/1999 | Kohama |
| 5,945,867 A | 8/1999 | Uda et al. |
| 5,959,335 A | 9/1999 | Bryant et al. |
| 5,969,988 A | 10/1999 | Tanzawa et al. |
| 5,986,649 A | 11/1999 | Yamazaki |
| 6,020,781 A | 2/2000 | Fujioka |
| 6,064,275 A | 5/2000 | Yamauchi |
| 6,064,872 A | 5/2000 | Vice |
| 6,081,165 A | 6/2000 | Goldman |
| 6,087,968 A | 7/2000 | Roza |
| 6,094,103 A | 7/2000 | Jeong et al. |
| 6,107,885 A | 8/2000 | Miguelez et al. |
| 6,122,185 A | 9/2000 | Utsunomiya et al. |
| 6,130,572 A | 10/2000 | Ghilardelli et al. |
| 6,169,444 B1 | 1/2001 | Thurber, Jr. |
| 6,188,590 B1 | 2/2001 | Chang et al. |
| 6,195,307 B1 | 2/2001 | Umezawa et al. |
| RE37,124 E | 4/2001 | Monk et al. |
| 6,226,206 B1 | 5/2001 | Maeda |
| 6,249,446 B1 | 6/2001 | Shearon et al. |
| 6,297,687 B1 | 10/2001 | Sugimura |
| 6,308,047 B1 | 10/2001 | Yamamoto et al. |
| 6,337,594 B1 | 1/2002 | Hwang |
| 6,339,349 B1 | 1/2002 | Rajagopalan |
| 6,356,062 B1 | 3/2002 | Elmhurst et al. |
| 6,400,211 B1 | 6/2002 | Yokomizo et al. |
| 6,411,531 B1 | 6/2002 | Nork et al. |
| 6,414,863 B1 | 7/2002 | Bayer et al. |
| 6,424,585 B1 | 7/2002 | Ooishi |
| 6,429,632 B1 | 8/2002 | Forbes et al. |
| 6,429,723 B1 | 8/2002 | Hastings |
| 6,429,730 B2 | 8/2002 | Houghton et al. |
| 6,429,732 B1 | 8/2002 | Tedrow et al. |
| 6,452,232 B1 | 9/2002 | Adan |
| 6,486,728 B2 | 11/2002 | Kleveland |
| 6,486,729 B2 | 11/2002 | Imamiya |
| 6,496,074 B1 | 12/2002 | Sowlati |
| 6,504,213 B1 | 1/2003 | Ebina |
| 6,518,829 B2 | 2/2003 | Butler |
| 6,535,071 B2 | 3/2003 | Forbes |
| 6,537,861 B1 | 3/2003 | Kroell et al. |
| 6,559,689 B1 | 5/2003 | Clark |
| 6,563,366 B1 | 5/2003 | Kohama |
| 6,617,933 B2 | 9/2003 | Ito et al. |
| 6,653,697 B2 | 11/2003 | Hidaka et al. |
| 6,661,682 B2 | 12/2003 | Kim et al. |
| 6,677,641 B2 | 1/2004 | Kocon |
| 6,714,065 B2 | 3/2004 | Komiya et al. |
| 6,717,458 B1 | 4/2004 | Potanin |
| 6,737,926 B2 | 5/2004 | Forbes |
| 6,744,224 B2 | 6/2004 | Ishii |
| 6,762,704 B1 | 7/2004 | Melanson et al. |

(56) References Cited

U.S. PATENT DOCUMENTS

| | | |
|---|---|---|
| 6,784,737 B2 | 8/2004 | Martin et al. |
| 6,788,130 B2 | 9/2004 | Pauletti et al. |
| 6,788,578 B1 | 9/2004 | Tang |
| 6,794,927 B2 | 9/2004 | Bedarida et al. |
| 6,801,076 B1 | 10/2004 | Merritt |
| 6,803,807 B2 | 10/2004 | Fujiyama et al. |
| 6,806,761 B1 | 10/2004 | Aude |
| 6,809,603 B1 | 10/2004 | Ho |
| 6,812,775 B2 | 11/2004 | Seo |
| 6,816,000 B2 | 11/2004 | Miyamitsu |
| 6,816,001 B2 | 11/2004 | Khouri et al. |
| 6,816,016 B2 | 11/2004 | Sander et al. |
| 6,819,187 B1 | 11/2004 | Ming et al. |
| 6,819,938 B2 | 11/2004 | Sahota |
| 6,825,699 B2 | 11/2004 | Marshall et al. |
| 6,825,730 B1 | 11/2004 | Sun |
| 6,828,614 B2 | 12/2004 | Gonzalez |
| 6,831,499 B2 | 12/2004 | Oddone et al. |
| 6,831,847 B2 | 12/2004 | Perry |
| 6,833,745 B2 | 12/2004 | Hausmann et al. |
| 6,833,752 B2 | 12/2004 | Merritt et al. |
| 6,836,173 B1 | 12/2004 | Yang |
| 6,836,176 B2 | 12/2004 | Zeng et al. |
| 6,844,762 B2 | 1/2005 | Sanchez |
| 6,847,251 B2 | 1/2005 | Kao |
| 6,853,566 B2 | 2/2005 | Itoh |
| 6,855,655 B2 | 2/2005 | Wagner et al. |
| 6,856,177 B1 | 2/2005 | de Frutos et al. |
| 6,871,059 B1 | 3/2005 | Piro et al. |
| 6,879,502 B2 | 4/2005 | Yoshida et al. |
| 6,891,234 B1 | 5/2005 | Connelly et al. |
| 6,906,575 B2 | 6/2005 | Tanaka |
| 6,947,720 B2 | 9/2005 | Razavi et al. |
| 6,954,623 B2 | 10/2005 | Chang et al. |
| 6,967,523 B2 * | 11/2005 | DeMone .................. 327/537 |
| 7,023,260 B2 * | 4/2006 | Thorp et al. .............. 327/536 |
| 7,042,245 B2 | 5/2006 | Hidaka |
| 7,098,734 B2 | 8/2006 | Hongo et al. |
| 7,109,532 B1 | 9/2006 | Lee et al. |
| 7,123,898 B2 | 10/2006 | Burgener et al. |
| 7,129,796 B2 | 10/2006 | Goto |
| 7,161,197 B2 | 1/2007 | Nakatsuka et al. |
| 7,180,794 B2 | 2/2007 | Matsue |
| 7,190,222 B2 | 3/2007 | Okazaki et al. |
| 7,202,712 B2 | 4/2007 | Athas |
| 7,212,788 B2 | 5/2007 | Weber et al. |
| 7,355,455 B2 | 4/2008 | Hidaka |
| 7,359,677 B2 | 4/2008 | Huang et al. |
| 7,391,282 B2 | 6/2008 | Nakatsuka et al. |
| 7,430,133 B1 | 9/2008 | McIntyre et al. |
| 7,457,594 B2 | 11/2008 | Theobold et al. |
| 7,460,852 B2 | 12/2008 | Burgener et al. |
| 7,486,128 B2 | 2/2009 | Yen et al. |
| 7,515,882 B2 | 4/2009 | Kelcourse et al. |
| 7,532,061 B2 | 5/2009 | Ragone et al. |
| 7,545,216 B2 | 6/2009 | Hamley |
| 7,546,089 B2 | 6/2009 | Bellantoni |
| 7,551,036 B2 | 6/2009 | Berroth et al. |
| 7,560,977 B2 | 7/2009 | Miyazaki et al. |
| 7,602,227 B2 | 10/2009 | Kim et al. |
| 7,609,109 B2 | 10/2009 | Arisawa |
| 7,659,152 B2 | 2/2010 | Gonzalez et al. |
| 7,667,529 B2 | 2/2010 | Consuelo et al. |
| 7,719,343 B2 | 5/2010 | Burgener et al. |
| 7,733,156 B2 | 6/2010 | Brederlow et al. |
| 7,733,157 B2 | 6/2010 | Brederlow et al. |
| 7,741,869 B2 | 6/2010 | Hidaka |
| 7,756,494 B2 | 7/2010 | Fujioka et al. |
| 7,786,807 B1 | 8/2010 | Li et al. |
| 7,796,969 B2 | 9/2010 | Kelly et al. |
| 7,817,966 B2 | 10/2010 | Prikhodko et al. |
| 7,860,499 B2 | 12/2010 | Burgener et al. |
| 7,868,683 B2 | 1/2011 | Ilkov |
| 7,910,993 B2 | 3/2011 | Brindle et al. |
| 7,920,026 B2 | 4/2011 | Hughes |
| 7,928,759 B2 | 4/2011 | Hidaka |
| 7,936,213 B2 | 5/2011 | Shin et al. |
| 7,944,277 B1 | 5/2011 | Sinitsky et al. |
| 7,956,675 B2 | 6/2011 | Saitoh et al. |
| 7,969,235 B2 * | 6/2011 | Pan ........................... 327/537 |
| 7,982,265 B2 | 7/2011 | Challa et al. |
| 8,072,258 B2 | 12/2011 | Yamahira |
| 8,103,226 B2 | 1/2012 | Andrys et al. |
| 8,131,251 B2 | 3/2012 | Burgener et al. |
| 8,195,103 B2 | 6/2012 | Waheed et al. |
| 8,253,494 B2 | 8/2012 | Biednov |
| 8,373,490 B2 | 2/2013 | Burgener et al. |
| 8,378,736 B2 | 2/2013 | Burgener et al. |
| 8,559,907 B2 | 10/2013 | Burgener et al. |
| 8,649,754 B2 | 2/2014 | Burgener et al. |
| 8,674,749 B2 | 3/2014 | Tran et al. |
| 8,686,787 B2 | 4/2014 | Swonger |
| 8,816,659 B2 | 8/2014 | Kim et al. |
| 8,994,452 B2 | 3/2015 | Kim et al. |
| 9,030,248 B2 | 5/2015 | Kim et al. |
| 9,190,902 B2 | 11/2015 | Burgener et al. |
| 9,264,053 B2 | 2/2016 | Englekirk |
| 9,354,654 B2 | 5/2016 | Swonger |
| 2001/0013814 A1 | 8/2001 | Arisawa |
| 2001/0031518 A1 | 10/2001 | Kim et al. |
| 2002/0115244 A1 | 8/2002 | Park et al. |
| 2002/0140412 A1 | 10/2002 | Maneatis |
| 2002/0153940 A1 | 10/2002 | Wurcer et al. |
| 2002/0171486 A1 | 11/2002 | Krupnik |
| 2003/0002452 A1 | 1/2003 | Sahota |
| 2003/0034849 A1 | 2/2003 | Sanduleanu |
| 2003/0090313 A1 | 5/2003 | Burgener et al. |
| 2003/0141543 A1 | 7/2003 | Bryant et al. |
| 2003/0201494 A1 | 10/2003 | Maeda et al. |
| 2004/0061130 A1 | 4/2004 | Morizuka |
| 2004/0080364 A1 | 4/2004 | Sander et al. |
| 2004/0129975 A1 | 7/2004 | Koh et al. |
| 2004/0204013 A1 | 10/2004 | Ma et al. |
| 2005/0052220 A1 | 3/2005 | Burgener et al. |
| 2005/0068102 A1 | 3/2005 | Hongo et al. |
| 2005/0077564 A1 | 4/2005 | Forbes |
| 2005/0121699 A1 | 6/2005 | Chen et al. |
| 2005/0195030 A1 | 9/2005 | Okazaki et al. |
| 2006/0006955 A1 | 1/2006 | Arisawa |
| 2006/0194558 A1 | 8/2006 | Kelly |
| 2006/0220747 A1 | 10/2006 | Kiji |
| 2006/0281418 A1 | 12/2006 | Huang et al. |
| 2006/0284670 A1 | 12/2006 | Eid et al. |
| 2007/0045697 A1 | 3/2007 | Cheng et al. |
| 2007/0069801 A1 | 3/2007 | Ragone et al. |
| 2007/0146064 A1 | 6/2007 | Morie et al. |
| 2007/0229156 A1 | 10/2007 | Alenin et al. |
| 2007/0243849 A1 | 10/2007 | Prikhodko et al. |
| 2007/0279120 A1 | 12/2007 | Brederlow et al. |
| 2008/0007980 A1 | 1/2008 | Fujiwara |
| 2008/0030237 A1 | 2/2008 | Danioni et al. |
| 2008/0044041 A1 | 2/2008 | Tucker et al. |
| 2008/0076371 A1 | 3/2008 | Dribinsky et al. |
| 2008/0116979 A1 | 5/2008 | Lesso et al. |
| 2008/0166984 A1 | 7/2008 | Shie et al. |
| 2008/0246543 A1 | 10/2008 | Trifonov et al. |
| 2008/0272833 A1 | 11/2008 | Ivanov et al. |
| 2008/0272845 A1 | 11/2008 | Willassen et al. |
| 2008/0298605 A1 | 12/2008 | Fan et al. |
| 2009/0066407 A1 * | 3/2009 | Bowman et al. ............ 327/536 |
| 2009/0174495 A1 | 7/2009 | Arisawa |
| 2009/0251215 A1 | 10/2009 | Hughes |
| 2010/0033226 A1 | 2/2010 | Kim et al. |
| 2010/0052771 A1 | 3/2010 | Hartono |
| 2010/0214010 A1 | 8/2010 | Burgener et al. |
| 2010/0245327 A1 | 9/2010 | Tsujino et al. |
| 2011/0156819 A1 | 6/2011 | Kim et al. |
| 2011/0163779 A1 | 7/2011 | Hidaka |
| 2011/0299437 A1 | 12/2011 | Mikhemar et al. |
| 2012/0007679 A1 | 1/2012 | Burgener et al. |
| 2012/0038344 A1 | 2/2012 | Kim et al. |
| 2012/0049956 A1 | 3/2012 | Lam |
| 2012/0086512 A1 | 4/2012 | Sharma et al. |
| 2012/0105127 A1 | 5/2012 | Burgener et al. |

(56) References Cited

U.S. PATENT DOCUMENTS

| | | | |
|---|---|---|---|
| 2012/0148001 A1 | 6/2012 | Yashima | |
| 2012/0242379 A1 | 9/2012 | Obkircher et al. | |
| 2012/0286854 A1 | 11/2012 | Swonger | |
| 2013/0229841 A1* | 9/2013 | Giuliano | 363/60 |
| 2014/0055194 A1 | 2/2014 | Burgener et al. | |
| 2014/0085006 A1 | 3/2014 | Mostov et al. | |
| 2014/0087673 A1 | 3/2014 | Mostov et al. | |
| 2015/0002195 A1 | 1/2015 | Englekirk | |
| 2015/0084610 A1 | 3/2015 | Kim et al. | |

FOREIGN PATENT DOCUMENTS

| | | |
|---|---|---|
| EP | 0622901 | 11/1994 |
| EP | 0 938 094 A1 | 8/1999 |
| EP | 1664966 | 7/2006 |
| EP | 2330735 A2 | 6/2011 |
| EP | 2346169 | 7/2011 |
| EP | 2385616 A2 | 9/2011 |
| EP | 2421132 | 2/2012 |
| EP | 2830203 | 1/2014 |
| EP | 1664966 | 7/2014 |
| GB | 2451525 | 2/2009 |
| JP | 55-75348 | 6/1980 |
| JP | 01-254014 | 11/1989 |
| JP | 04-34980 | 2/1992 |
| JP | 04-334105 | 11/1992 |
| JP | 05-111241 | 4/1993 |
| JP | 06-152334 | 5/1994 |
| JP | 06-314985 | 11/1994 |
| JP | 06-334506 | 12/1994 |
| JP | 08-148949 | 6/1996 |
| JP | 08-307305 | 11/1996 |
| JP | 09-161472 | 6/1997 |
| JP | 09-200021 | 7/1997 |
| JP | 10-93471 | 4/1998 |
| JP | 10-242477 | 9/1998 |
| JP | 10-242829 | 9/1998 |
| JP | 11-136111 | 5/1999 |
| JP | 11-252900 | 9/1999 |
| JP | 2000-166220 | 6/2000 |
| JP | 2001-051758 | 2/2001 |
| JP | 2001-119281 | 4/2001 |
| JP | 2001-119927 | 4/2001 |
| JP | 2002-119053 | 4/2002 |
| JP | 03-060451 | 2/2003 |
| JP | 03-198248 | 7/2003 |
| JP | 2004-147175 | 5/2004 |
| JP | 2005-057860 | 3/2005 |
| JP | 2006-352326 | 12/2006 |
| JP | 5675529 | 1/2015 |
| WO | WO 95/23460 A1 | 8/1995 |
| WO | WO98/58382 | 12/1998 |
| WO | 2005-043267 | 5/2005 |
| WO | 2009/063661 | 5/2009 |
| WO | 2010/008586 | 1/2010 |
| WO | WO2012058122 | 5/2012 |

OTHER PUBLICATIONS

Kim, et al., Preliminary Amendment filed in the USPTO dated Jan. 18, 2011 for related U.S. Appl. No. 13/504,78, 7 pgs.
Nguyen, Hieu P., Office Action received from the USPTO dated Nov. 14, 2012 for related U.S. Appl. No. 13/504,781, 5 pgs.
Kim, et al., Response filed in the USPTO dated Oct. 11, 2013 for related U.S. Appl. No. 13/054,781, 13 pgs.
Nguyen, Hieu P., Notice of Allowance received from the USPTO dated Jul. 8, 2014 for related U.S. Appl. No. 13/504,781, 61 pgs.
Peregrine Semiconductor Corporation, photocopy of an Article 19 Amendment Under Section 205(b) and Rule 46.5(b) PCT and claims for related appln. No. PCT/US2009/004149 dated May 13, 2011, 17 pages.
European Patent Office, photocopy of Communication Pursuant to Rules 161(2) and 162 EPC received from the EPO for related appln. No. 09798318.3 dated May 19, 2011, 2 pgs.
Wells, Kenneth B., Office Action received from the USPTO dated Dec. 26, 2012 for related U.S. Appl. No. 13/105,743, 6 pgs.
Swonger, et al., Response filed in the USPTO dated Jan. 28, 2013 for related U.S. Appl. No. 13/105,743, 7 pg.
Meulemans, Bart, Communication received from the EPO dated Oct. 22, 2013 for related appl. No. 11154275.9, 6 pgs.
Englund, Terry Lee, Office Action received from the USPTO dated Dec. 6, 2013 for related U.S. Appl. No. 13/769,780, 18 pgs.
Peregrine Semiconductor Corporation, Response filed in the EPO on Oct. 10, 2011 for related appln. No. 09798318.3, 3 pgs.
European Patent Office, Communication pursuant to Rules 90(2) and 70a(2) EPC received from the EPO dated Feb. 14, 2014 for related appln. No. 09798318.3, 1 pg.
Peregrine Semiconductor Corporation, Response filed in the EPO on Oct. 11, 2011 for related appln. No. 11154275.9 4 pgs.
Peregrine Semiconductor Corporation, Request for Exam and Response filed in the EPO on May 9, 2014 for related appln. No. 11154275.9 4 pgs.
Houston, Adam, Office Action received from the USPTO dated Jun. 26, 2012 for related U.S. Appl. No. 12/913,575, 19 pgs.
Houston, Adam, Notice of Allowance received from the USPTO dated Aug. 27, 2012 for related U.S. Appl. No. 12/913,575, 9 pgs.
Nguyen, Khanh V., Office Action received from the USPTO dated Nov. 4, 2011 for related U.S. Appl. No. 12/807,365, 14 pgs.
Nguyen, Khanh V., Office Action received from the USPTO dated Apr. 5, 2012 for related U.S. Appl. No. 12/807,365, 10 pgs.
Ghilini, Marie, International Search Report and Written Opinion received from the EPO dated Apr. 16, 2012 for related appln. No. PCT/US2011/057381, 11 pgs.
Peregrine Semiconductor Corporation, Demand filed in the EPO dated Aug. 24, 2012 for related appln. No. PCT/US2011/057381, 24 pgs.
Nguyen, Khanh V., Notice of Allowance received from the USPTO dated Sep. 6, 2012 for related U.S. Appl. No. 12/807,365, 13 pgs.
Ratajski, Andre, Written Opinion of the International Preliminary Examining Authority received from the EPO dated Oct. 18, 2012 for related appln. No. PCT/US2011/057381, 6 pgs.
Burgener, et al., Response filed in the USPTO dated Jul. 23, 2012 for related U.S. Appl. No. 12/913,575, 7 pgs.
Swonger, James, Preliminary Amendment filed in the USPTO dated Jul. 22, 2011 for related U.S. Appl. No. 13/105,743, 15 pgs.
Imbernon, Lisa, Communication Pursuant to Article 94(3) EPC received from the EPO dated May 18, 2011 for related appln. No. 04816848.8, 5 pgs.
Peregrine Semiconductor Corporation, Response filed in the EPO dated Nov. 28, 2011 for related appln. No. 04816848.8, 18 pgs.
Sircus, Brian, International Preliminary Report on Patentability received from the USRO dated Aug. 10, 2011 for related appln. No. PCT/US2009/004149, 17 pgs.
Kurzbauer, Werner, Communication under Rule 71(3) EPC received from the EPO dated May 23, 2012 for related appln. No. 11175503.9-2215, 60 pgs.
Le, Dinh Thanh, Notice of Allowance received from the USPTO dated Nov. 7, 2013 for related appln. No. 12/460,422, 16 pgs.
Wells, Kenneth, Notice of Allowance received from the USPTO dated Jul. 24, 2013 for related U.S. Appl. No. 13/105,743, 10 pgs.
Burgener, et al., Response filed in the USPTO dated Jun. 3, 2014 for related U.S. Appl. No. 13/796,780, 17 pgs.
Peregrine Semiconductor Corporation, Response and English translation filed in the Japanese Patent Office dated Jun. 3, 2014 for related appln. No. 2011-171908, 21 pgs.
Kim, et al., Comments on Examiner's Statement of Reasons for Allowance filed in the USPTO dated Jul. 14, 2014 for related U.S. Appl. No. 13/016,875, 3 pgs.
European Patent Office, Decision to Grant a European Patent Pursuant to Article 97(1) EPC dated Jul. 3, 2014 for related appln. No. 04816848.8, 2 pgs.
Le, Dinh Thanh, Notice of Allowance received from the USPTO dated Jul. 8, 2014 for related U.S. Appl. No. 12/460,442, 15 pgs.
Peregrine Semiconductor Corporation, Response filed in the USPTO dated Aug. 19, 2014 for related appln. No. 09798318.3, 20 pgs.

(56) References Cited

OTHER PUBLICATIONS

Moon, et al., "TA 7.1: A Low-Distortion 22kHz 5th-Order Bessel Filter", ISSCC 93/Session 7/Analog Techniques/Paper TA 7.1, 1993 IEEE International Solid-State Circuits Conference, pp. 110-111 and 271.
Tran, Pablo, Office Action received from the USPTO dated Feb. 3, 2012 for related U.S. Appl. No. 12/903,848, 46 pgs.
Fedi, Giulio, Extended Search Report received from the EPO dated Mar. 5, 2012 for related appln. No. 11154277.5, 8 pgs.
Adams, W. J., et al., "OTA Extended Adjustment Range and Linearization Via Programmable Current Mirrors", Circuits and Systems, 1991, Proceedings of the 34th Midwest Symposium on Monterey, CA, USA 14-17 May 14, 1991.
Bogdan Pankiewicz, et al., "A Field Programmable Analog Array for CMOS Continuous-Time OTA-C Filter Applications", IEEE Journal of Solid-State Circuits, IEEE Service Center, vol. 37, No. 2, Feb. 1, 2002.
Jader, et al., "A Linearly Tunable Low-Voltage CMOS Transconductor with Improved Common-Mode Stability and Its Application to gm-C Filters", IEEE Transactions on Circuits and Systems II: Analog and Digitalsignal Processing, vol. 48, No. 7, Jul. 1, 2001.
Peregrine Semiconductor Corporation, Amendment filed in the EPO dated Mar. 5, 2012 for related appln. No. 11175503.9, 10 pgs.
Ghilini, Marie, Communication under Rule 71(3) EPC received from the EPO dated May 23, 2012 for related appln. No. 11175503.9, 60 pgs.
Wang, Chi-Chang, et al., "Efficiency Improvement in Charge Pump Circuits", IEEE Journal of Solid-State Circuits, vol. 32, No. 6, Jun. 1997, pp. 852-860.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Cherne, et al., U.S. Statutory Invention Registration, Registration No. H1435, May 2, 1995.
Ohyama, Hirohito, Translation of an Office Action of Japan Patent Office dated Aug. 7, 2012 for related appln. No. 2010-040443, 1 pg.
Lee, et al., "Analysis of Body Bias Effect with PD-SOI for Analog and RF Application", Solid State Electron, vol. 46, 2002, pp. 1169-1176.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Hittite Microwave, Floating Ground SPNT MMIC Switch Driver Techniques, 2001.
Caverly, et al., "Gallium Nitride-Based Microwave and RF Control Devices", 2001.
Sedra, et al., "Microelectronic Circuits", University of Toronto, Oxford University Press, Fourth Edition, 1982, 1987, 1991, 1998, pp. 374-375.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Peregrine Semiconductor Corporation, Response filed in the EPO dated Oct. 2, 2012 for related appln. No. 11154277.55, 14 pgs.
Tran, Pablo, Notice of Allowance received from the USPTO dated Oct. 26, 2012 for related U.S. Appl. No. 12/903,848, 14 pgs.
Englund, Terry Lee, Office Action received from the USPTO dated Apr. 5, 2011 for related U.S. Appl. No. 12/799,583, 5 pgs.
Burgener, et al., Amendment filed in the USPTO dated Jun. 6, 2011 for related U.S. Appl. No. 12/799,583, 7 pgs.
Englund, Terry Lee, Office Action received from the USPTO dated Aug. 18, 2011 for related U.S. Appl. No. 12/799,583, 47 pgs.
Burgener, et al., Amendment filed in the USPTO dated Feb. 17, 2012 for related U.S. Appl. No. 12/799,583, 24 pgs.
Englund, Terry Lee, Final Office Action received from the USPTO dated Apr. 20, 2012 for related U.S. Appl. No. 12/799,583, 20 pgs.
Burgener, et al., Amendment filed in the USPTO dated Jun. 19, 2012 for related U.S. Appl. No. 12/799,583, 3 pgs.
Englund, Terry Lee, Notice of Allowance received from the USPTO dated Jul. 5, 2012 for related U.S. Appl. No. 12/799,583, 8 pgs.
Englund, Terry Lee, Notice of Allowance received from the USPTO dated Oct. 12, 2012 for related U.S. Appl. No. 12/799,583, 26 pgs.
Burgener, et al., Comments on Examiner's Statement of Reasons for Allowance filed in the USPTO dated Jan. 14, 2013 for related U.S. Appl. No. 12/799,583, 3 pgs.
Maxim Integrated Products, "Charge Pumps Shine in Portable Designs", published Mar. 15, 2001, pp. 1-13.
Nork, Sam, "New Charge Pumps Offer Low Input and Output Noise", Linear Technology Corporation, Design Notes, Design Note 243, Nov. 2000, pp. 1-2.
Linear Technology, "LTC1550I/LTC1551L: Low Noise Charge Pump Inverters in MS8 Shrink Cell Phone Designs", Dec. 1998, pp. 1-2.
Lascari, Lance, "Accurate Phase Noise Prediction in PLL Synthesizers", Applied Microwave & Wireless, May 2000, pp. 90-96.
Texas Instruments, "TPS60204, TPS60205, Regulated 3.3-V, 100-mA Low-Ripple Charge Pump, Low Power DC/DC Converters", Feb. 2001, Revised Sep. 2001, pp. 1-18.
Imbernon, Lisa, Communication from the European Patent office for related appln. No. 048168488, dated Apr. 6, 2009, 2 pages.
Yasuike, Kazuki, English translation of an Office Action of related appln. No. 2006-525525 received from the Japanese atent Office dated Aug. 25, 2009, 3 pgs.
Englund, Terry Lee, Office Action received from related U.S. Appl. No. 10/658,154, dated Dec. 1, 2004, 26 pages.
Burgener, Mark, et al., Amendment filed in USPTO for related U.S. Appl. No. 10/658,154, dated Apr. 1, 2005, 27 pages.
Englund, Terry Lee, Office Action received from related U.S. Appl. No. 10/658,154, dated Aug. 10, 2005, 39 pages.
Burgener, Mark, et al., Amendment After Final filed in USPTO for related U.S. Appl. No. 10/658,154, dated Oct. 11, 2005, 32 pages.
Englund, Terry, Advisory Action received from the USPTO for related U.S. Appl. No. 10/658,154, dated Nov. 2, 2005, 2 pages.
Burgener, Mark, et al., Notice of Appeal filed in USPTO for related U.S. Appl. No. 10/658,154, dated Nov. 10, 2005, 1 page.
Burgener, Mark, et al., Petition for Revival of Appln. and Facts Statement filed in USPTO for related U.S. Appl. No. 10/658,154, dated Jan. 4, 2007, 4 pgs.
Englund, Terry, Not. of Non-Compliant Appeal Brief received from the USPTO for related U.S. Appl. No. 10/658,154, dated Nov. 2, 2006, 7 pages.
Burgener, Mark, et al., Amended Appeal Brief filed in USPTO for related U.S. Appl. No. 10/658,154, dated Jan. 5, 2007, 170 pages.
Burgener, Mark, et al., Pet. to Expedite Previous Petition filed in USPTO for related U.S. Appl. No. 10/658,154, dated Jan. 8, 2007, 6 pgs.
McLaughlin, Kenya, Decision of Petition under 37 CFR 1.137(f) received from USPTO for related U.S. Appl. No. 10/658,154, dated Jan. 31, 2007, 1 page.
McLaughlin, Kenya, Decision Granting received from USPTO for related U.S. Appl. No. 10/658,154, dated Mar. 28, 2007, 1 page.
Englund, Terry, Office Action received from the USPTO for related U.S. Appl. No. 10/658,154, dated May 17, 2007, 52 pages.
Burgener, Mark, et al., Amendment After Re-Opening Prosecution filed in USPTO for related U.S. Appl. No. 10/658,154, dated Sep. 17, 2007, 31 page.
Englund, Terry, Final Office Action received from the USPTO for related U.S. Appl. No. 10/658,154, dated Dec. 12, 2007, 52 pages.

(56) References Cited

OTHER PUBLICATIONS

Burgener, Mark, et al., Not. of Appeal, Pre-Appeal Brief Req. and Pre-Appeal Brief Request for Review filed in USPTO for related U.S. Appl. No. 10/658,154, dated May 12, 2008, 7 pages.
Englund, Terry, Not. of Non-Compliant Appeal Brief received from the USPTO for related U.S. Appl. No. 10/658,154, dated Apr. 1, 2009, 2 pages.
Burgener, Mark, et al., Amended Appeal Brief filed in USPTO for related U.S. Appl. No. 10/658,154, dated Jun. 1, 2009, 175 pages.
Englund, Terry, Interview Summary received from the USPTO for related U.S. Appl. No. 10/658,154, dated Oct. 9, 2009, 3 pages.
Burgener, Mark, et al., Stmt. of Substance of Interview filed in USPTO for related U.S. Appl. No. 10/658,154, dated Nov. 9, 2009, 20 pages.
Burgener, Mark, et al., Amendment filed in USPTO for related U.S. Appl. No. 10/658,154, dated Dec. 2, 2009, 19 pages.
Englund, Terry, Notice of Allowance received from the USPTO for related U.S. Appl. No. 10/658,154, dated Jan. 11, 2010, 22 pages.
Burgener, Mark, et al., Issue Fee Transmittal filed in USPTO for related U.S. Appl. No. 10/658,154, dated Mar. 23, 2010, 1 page.
Tran, Pablo N., Office Action received from the USPTO dated Oct. 29, 2009 for related U.S. Appl. No. 11/501,125, 19 pages.
Ebner von Eschenbach, Jennifer, Communication and Supplementary Search Report received from the EPO dated Nov. 27, 2009 for related appln. No. 05763216.8, 10 pages.
Kai, Tetsuo, Translation of an Office Action received from the Japanese Patent Office dated Mar. 29, 2011 for related Japanese appln. No. 2010-232563, 4 pgs.
Imbernon, Lisa, Communication Pursuant to Article 94(3) EPC received from EPO dated May 18, 2011 for related appln. No. 04816848.8, 5 pgs.
Sircus, Brian, Notification of Transmittal of International Preliminary Report on Patentability dated Aug. 10, 2011 for related application No. PCT/US2009/04149, 17 pgs.
European Patent Office, Invitation pursuant to Rule 63(1) EPC dated Aug. 19, 2011 for related appln. No. 11154275.9, 3 pgs.
Tran, Pablo N., Notice of Allowance received from the USPTO dated Oct. 6, 2011 for related U.S. Appl. No. 11/501,125, 11 pgs.
Kurzbauer, Werner, Extended European Search Report received from the EPO dated Dec. 6, 2011 for related appln. No. 11175503.9, 4 pgs.
Burke, Julie, International Search Report received from the USRO dated Jul. 28, 2005 for related appln. No. PCT/US2004/029166, 11 pgs.
Wells, Kenneth B., Office Action received from the USPTO dated Feb. 13, 2013 for related U.S. Appl. No. 13/105,743, 55 pgs.
Tran, Pablo No., Notice of Allowance received from the USPTO dated Feb. 15, 2013 for related U.S. Appl. No. 12/903,848, 26 pgs.
Mehari, Yemane, Office Action received from the USPTO dated Mar. 15, 2013 for related U.S. Appl. No. 13/016,875, 83 pgs.
Kim, et al., Amendment—Response to Restriction filed in the USPTO dated Apr. 15, 2013 for related U.S. Appl. No. 13/054,781, 5 pgs.
Nguyen, Hieu P., Office Action received from USPTO dated Jun. 11, 2013 for related U.S. Appl. No. 13/054,781, 45 pgs.
Swonger, James, Response filed in the USPTO dated Jun. 12, 2013 for related U.S. Appl. No. 13/105,743, 21 pgs.
Kim, et al., Amendment filed in the USPTO dated Jul. 12, 2013 for related U.S. Appl. No. 13/016,875, 8 pgs.
Tokuda, Kenji, Office Action and English Translation received from the Japanese Patent Office dated Jul. 13, 2013 for related appln. No. 2011-518737, 10 pgs.
Wells, Kenneth B., Notice of Allowance received from the USPTO dated Jul. 24, 2013 for related U.S. Appl. No. 13/105,743, 10 pgs.
Sasaki, Satoshi, English translation of Office Action received from the Japanese Patent Office dated Jul. 23, 2013 for related appln. No. 2011-171908, 2 pgs.
Mehari, Yemane, Notice of Allowance received from the USPTO dated Aug. 20, 2013 for related U.S. Appl. No. 13/016,875, 17 pgs.
Tran, Pablo N. Notice of Allowance received from the USPTO dated Aug. 28, 2013 for related U.S. Appl. No. 12/903,848, 18 pgs.

Muelemans, Bart, Extended Search Report received from the EPO dated Oct. 22, 2013 for related appln. No. 11154275.9, 6 pgs.
Wells, Kenneth B., Notice of Allowance received from the USPTO dated Nov. 7, 2013 for related U.S. Appl. No. 13/105,743, 11 pgs.
Le, Dinh Thanh, Notice of Allowance received from the USPTO dated Nov. 7, 2013 for related U.S. Appl. No. 12/460,442, 16 pgs.
Gentili, Luigi, Communication under Rule 71(3) EPC received from the EPO dated Nov. 14, 2013 for related appln. No. 04816848.8, 43 pgs.
European Patent Office, Communication pursuant to Rule 69 EPC received from the EPO dated Nov. 25, 2013 for related appln. No. 11154275.9, 2 pgs.
Mehari, Yeman, Notice of Allowance received from the USPTO dated Jan. 2, 2014 for related U.S. Appl. No. 13/016,875, 15 pgs.
Meulemans, Bart, Supplementary European Search Report received from the EPO dated Jan. 22, 2014 for related appln. No. E09798318, 6 pgs.
Moon, et al., "Design of a Low-Distortion 22-kHz Fifth-Order Bessel Filter", IEEE Journal of Solid State Circuits, Dec. 28, 1993, No. 12, New York, US, pp. 1243-1263.
Matsumoto, Yasunori, English Translation of Office Action of Japan Patent Office dated Feb. 4, 2014 for related appln. No. 2012-243547, 2 pgs.
Peregrine Semiconductor Corporation, Response filed in the EPO dated Jan. 8, 2014 for related appln. No. 04816848.8, 13 pgs.
European Patent Office, Communication pursuant to Rules 90(2) and 70a(2) EPC received from EPO dated Feb. 14, 2014 for related appln. No. 09798318.3, 1 pg.
Gundlach, Susanne, Communication under Rule 71(3) EPC received from the EPO dated Feb. 14, 2014 for related appln. No. 04816848.8, 44 pgs.
Sakurada, Masaki, Office Action and English translation of Japanese Office Action received from the JPO dated Mar. 4, 2014 for related appln. No. 2011-171908, 20 pgs.
Le, Dinh Thanh, Notice of Allowance received from the USPTO dated Mar. 12, 2014 for related U.S. Appl. No. 12/460,442, 12 pgs.
Nguyen, Hieu P., Notice of Allowance received from the USPTO dated Mar. 13, 2014 for related U.S. Appl. No. 13/054,781, 19 pgs.
Mehari, Yemane, Notice of Allowance received from the USPTO dated Apr. 14, 2012 for related U.S. Appl. No. 13/016,875, 12 pgs.
Toscano, Oliveros, Communication under Rule 71(3) EPC dated Apr. 25, 2014 for related appln. No. 05763216.8, 47 pgs.
Peregrine Semiconductor Corporation, English translation of Response filed in the JPO filed Apr. 28, 2014 for related appln. No. 2012-243547, 5 pgs.
Tran, Pablo, Office Action received from the USPTO dated May 8, 2014 for related U.S. Appl. No. 14/052,680, 5 pgs.
Peregrine Semiconductor Corporation, Response filed in the EPO dated May 9, 2014 for related appln. No. 11154275.9, 4 pgs.
Hiltunen, Thomas J., Office Action received from the USPTO dated May 22, 2014 for related U.S. Appl. No. 13/933,006, 10 pgs.
Englund, Terry Lee, Final Office Action received from the USPTO dated Sep. 18, 2014 for related U.S. Appl. No. 13/769,780, 25 pgs.
European Patent Office, Invitation to Remedy Deficiencies received from the EPO dated Oct. 1, 2014 for related appln. No. 14178741.6, 1 pg.
Wells, Kenneth B., Office Action received from the USPTO dated Oct. 20, 2014 for related U.S. Appl. No. 14/230,945, 5 pgs.
Imbernon, Lisa, Extended Search Report received from the EPO dated Jan. 8, 2015 for appln. No. 14178741.6, 6 pgs.
Matsumoto, Yasunori, English translation of Office Action received from the JPO dated Feb. 10, 2015 for appln. No. 2012-243547, 2 pgs.
Kim, et al., Comments on Examiners Statement of Reasons for Allowance filed in the USPTO dated Feb. 13, 2015 for U.S. Appl. No. 13/054,781, 3 pgs.
Englekirk, Robert Mark, Response After Final Office Action filed in the USPTO dated Mar. 23, 2015 for U.S. Appl. No. 13/933,006, 16 pgs.
Wells, Kenneth, Final Office Action received from the USPTO dated May 6, 2015 for U.S. Appl. No. 14/230,945, 13 pgs.
Peregrine Semiconductor Corporation, English translation of Response filed in the JPO filed on May 12, 2015, 4 pgs.

(56) References Cited

OTHER PUBLICATIONS

Englekirk, Robert Mark, Response After Final Office Action filed in the USPTO dated Jun. 2, 2015 for U.S. Appl. No. 13/933,006, 17 pgs.
Hiltunen, Thomas, Final Office Action received from the USPTO dated Apr. 2, 2015 for U.S. Appl. No. 13/933,006, 20 pgs.
Swonger, James, Amendment filed in the USPTO dated Apr. 20, 2015 for U.S. Appl. No. 14/230,945, 9 pgs.
Wells, Kenneth, Notice of Allowance received from the USPTO dated May 4, 2015 for U.S. Appl. No. 13/769,780, 28 pgs.
Nguyen, Hieu P., Notice of Allowance received from the USPTO dated Nov. 13, 2014 for U.S. Appl. No. 13/054,781, 13 pgs.
Englekirk, Robert Mark, Response filed in the USPTO dated Nov. 13, 2014 for U.S. Appl. No. 13/933,006, 12 pgs.
Swonger, James, Response filed in the USPTO dated Dec. 18, 2014 for U.S. Appl. No. 14/230,945, 6 pgs.
Burgener, et al., Response After Final Office Action filed in the USPTO dated Dec. 18, 2014 for U.S. Appl. No. 13/769,780, 21 pgs.
Le, Dinh Thanh, Notice of Allowance received from the USPTO dated Jan. 2, 2015 for U.S. Appl. No. 12/460,442, 23 pgs.
Englund, Terry Lee, Advisory Action received from the USPTO dated Jan. 6, 2015 for U.S. Appl. No. 13/769,780, 12 pgs.
Wells, Kenneth, Office Action received from the USPTO dated Jan. 20, 2015 for U.S. Appl. No. 14/230,945, 13 pgs.
Hiltunen, Thomas J., Final Office Action received from the USPTO dated Jan. 23, 2015 for U.S. Appl. No. 13/933,006, 68 pgs.
Hiltunen, Thomas J., Notice of Allowance received from the USPTO dated Jun. 12, 2015 for U.S. Appl. No. 13/933,006, 17 pgs.
Swonger, James, Amendment filed in the USPTO dated Jul. 6, 2015 for U.S. Appl. No. 14/230,945, 10 pgs.
Peregrine Semiconductor Corporation, Response filed in the EPO dated Jul. 14, 2015 for appln. No. 14178741.6, 9 pgs.
Wells, Kenneth, Advisory Action received from the USPTO dated Jul. 15, 2014 for U.S. Appl. No. 14/230,945, 4 pgs.
Wells, Kenneth, Notice of Allowance received from the USPTO dated Sep. 4, 2015 for U.S. Appl. No. 13/769,780, 9 pgs.
Wells, Kenneth, Office Action received from the USPTO dated Sep. 4, 2015 for U.S. Appl. No. 14/230,945, 79 pgs.
Hiltunen, Thomas J., Notice of Allowance received from the USPTO dated Oct. 8, 2015 for U.S. Appl. No. 13/933,006, 9 pgs.
Swonger, James W., Amendment filed in the USPTO dated Dec. 1, 2015 for U.S. Appl. No. 14/230,945, 8 pgs.
Nguyen, Hieu P., Office Action received from the USPTO dated Dec. 30, 2015 for U.S. Appl. No. 14/638,954, 6 pgs.
Meulemans, Bart, Communication Pursuant to Article 94(3) EPC received from the EPO dated Dec. 17, 2014 for appln. No. 09798318.3, 4 pgs.
Wells, Kenneth, Notice of Allowance received from the USPTO dated Jan. 21, 2016 for U.S. Appl. No. 14/230,945, 14 pgs.
Mehari, Yemane, Notice of Allowance received from the USPTO dated Feb. 17, 2016 for U.S. Appl. No. 14/462,193, 37 pgs.
Suzuki, Shigeyuki, English Translation of an Office Action received from the JPO dated Feb. 2, 2016 for appln. No. 2014-260387, 3 pgs.
Kim, et al., Response to Restriction Requirement filed in USPTO dated Feb. 29, 2016 for U.S. Appl. No. 14/638,954, 8 pgs.
Mehari, Yemane, Notice of Allowance received from the USPTO dated Mar. 29, 2016 for U.S. Appl. No. 14/462,193, 17 pgs.
Hiltunen, Thomas, Office Action received from the USPTO dated Apr. 14, 2016 for U.S. Appl. No. 14/991,577, 13 pgs.
Swonger, James, Comments on Examiner's Statement of Reasons for Allowance filed in the USPTO dated Apr. 21, 2016 for U.S. Appl. No. 14/230,945, 4 pgs.
Peregrine Semiconductor Corporation, English translation of a Response filed in the JPO dated Apr. 28, 2016 for appln. No. 2014-260387, 9 pgs.
Nguyen, Hieu, Office Action received from the USPTO dated May 11, 2016 for U.S. Appl. No. 14/638,954, 79 pgs.

\* cited by examiner

US 9,413,362 B2

DIFFERENTIAL CHARGE PUMP

CROSS-REFERENCE TO RELATED APPLICATIONS

The present application is related to the following commonly assigned issued patents and applications: U.S. Pat. No. 7,719,343 issued May 18, 2010 entitled "Low Noise Charge Pump Method and Apparatus"; identically entitled U.S. Pat. No. 8,378,736 issued Feb. 19, 2013; U.S. patent application Ser. No. 13/054,781 filed Jan. 18, 2011, entitled "Low-Noise High Efficiency Bias Generation Circuits and Method"; U.S. Pat. No. 8,373,490 issued Feb. 12, 2013 entitled "Method, System and Apparatus for RF and DC Switching"; U.S. patent application Ser. No. 13/105,743 filed May 11, 2011, entitled "High Voltage Ring Pump" now issued as U.S. Pat. No. 8,686,787 on Apr. 1, 2014; and U.S. patent application Ser. No. 13/016,875 filed Jan. 28, 2011, entitled "Low-Noise High Efficiency Bias Generation Circuits and Method".

BACKGROUND (1) Technical Field

This invention generally relates to electronic power supplies, and more specifically to capacitive energy transfer DC-to-DC converters (DC/DC converters), such as charge pumps.

(2) Background

DC/DC converter power supply circuits provide a DC output voltage based upon a DC source voltage, where the output voltage is typically different than the input voltage. As the term is used herein, DC/DC converters do not encompass voltage reduction regulator circuits that use a linear pass device, but rather involve energy transfer from input to output through an energy storage device, such as a capacitor or an inductor.

A type of DC/DC converter is a "charge pump", which obtains energy for the output voltage primarily by means of capacitive transfer from the source to the output. Energy transfer capacitors used in charge pumps are typically known as "fly capacitors" or "fly caps". An inductor is not generally the primary energy transfer device in a charge pump, though of course hybrid devices are possible that employ inductive energy transfer in addition to capacitive energy transfer. A charge pump may derive an output voltage that is higher than a source voltage, or that is inverted from a source voltage, or that is referenced to a different voltage than the source voltage, and may do all of these things concurrently.

Charge pumps may be implemented for a wide variety of purposes. They are well suited for integrated circuit fabrication because the devices and elements required are compatible with most integrated circuit fabrication techniques. For example, a charge pump may be employed to generate a negative gate bias supply for an integrated circuit that switches an antenna between send and receive circuitry of a transceiver, as shown in FIG. 1. Many wireless transceivers, such as cellular telephones, employ a single antenna for both receiving and transmitting. While such systems are receiving, an antenna 102 must be coupled to receive circuitry 103 that may further include, for example, a filter 104 and a low noise amplifier 106, to provide the received signal for further processing. However, while such systems are transmitting, the antenna 102 must be disconnected from the sensitive receive circuitry 103 and coupled instead to relatively high power transmit circuitry 107. The transmit circuitry 107 may further include, for example, a power amplifier 108 and a transmit filter 110 to process a transmit signal. Note that the circuit shown in FIG. 1 is schematically simple for ease of understanding; in an actual implementation, there are often multiple transmit and receive circuits, and transmission and reception may be occurring on the same path at the same time.

A radio frequency (RF) switch 112 may be used to perform such antenna switching functions, as well as RF switching functions in general. Ideally, such switches may be integrated together with the receive and/or transmit circuitry, and in any event are desirably very small, due to integrated circuit die cost and space limitations in portable transceivers such as mobile telephones and handy talkies. In order to achieve good performance from switching devices, such as FETs, used to implement such RF switches, many designs need a special bias supply that extends negatively below the supply rails of the transmit and receive circuitry, such as a −3V supply. In view of the space and cost constraints of transceiver units such as mobile telephones, a charge pump is particularly suitable for generating such a bias supply because it can be readily integrated into a very small circuit and requires only a single external voltage supply, eliminating the need for multiple power supplies.

Fully-integrated charge pump based power supplies can be both electrically noisy and weak (i.e., not able to drive large load currents). The output drive strength is related to the frequency of the clock source driving the charge pump, and the size of the capacitors used to shuttle charge to a new voltage level. A higher clock frequency will improve the output drive strength but can allow for more noise coupling into the RF path. In particular, the frequency of the charge pump clock can show up as a distinct spur both at multiples of itself in baseband frequencies and/or at multiples of itself offset from whatever RF frequency is being utilized by a particular system. In the case of a switch with both transmit and receive signals present in different bands, it is possible for clock spurs offset from the transmit band to show up in the receive band. Thus it is desirable to use lower clock frequencies for charge pump circuits.

Using larger capacitors also improves drive strength of the charge pump, but doing so can consume a significant amount of integrated circuit chip area, and the more chip area that is used, the more coupling area there is to the RF path. Thus, there are trade-offs to be made to get to an optimal design for charge pump circuits used in a particular system.

In a simple single-stage charge pump, one capacitor is used as a "fly" capacitor, and one capacitor is used for a storage capacitor. The fly capacitor will alternately charge to some supply voltage +Vdd and then be switched to some other location to discharge into the "pumped" voltage supply, which is the new voltage supply being generated. In a simple negative charge pump example, the fly capacitor would be charged to Vdd relative to ground on one phase of a clock signal, and then on the other phase of the clock signal, the positive terminal would be tied to ground and the negative terminal to a storage capacitor to provide an output node Vss; this would charge Vss to be at −Vdd (thus the example circuit is a negative voltage "pumped" power supply; positive voltage charge pumps are equally well known in the art).

FIG. 2a is a schematic circuit diagram showing a prior art single-stage charge pump. FIG. 2b is a timing diagram of a two-phase clock signal 200 used in conjunction with the circuit shown in FIG. 2a. During phase 1 of the clock signal 200, switches 202 and 204 are closed and switches 208 and 210 are open, thereby coupling the positive terminal of the fly capacitor Cfly 206 to a supply voltage Vdd and the negative terminal to ground, thus charging Cfly to Vdd. During phase 2 of the clock signal 200, switches 202 and 204 are open and switches 208 and 210 are closed, thereby coupling the positive terminal of the fly capacitor Cfly 206 to ground and the negative terminal to a storage capacitor Cstorage1 212, thus charging Cstorage1 toward −Vdd. An output node Vss 214 provides the desired negative voltage "pumped" power supply, at approximately −Vdd.

The size of the storage capacitor used in charge pumps is generally determined by how much clock noise can be tolerated on the resulting pumped supply to a particular system. Typically, the storage capacitor has to be much larger than the fly capacitor. As such, to get an electrically quiet output, large amounts of capacitor area are required on an integrated circuit.

For two stage charge pumps, the problem gets compounded. A two-stage charge pump would for instance be used to create a supply of −2 Vdd or +3 Vdd. Two fly caps and two storage capacitors are required. The drive efficiency of the charge is reduced in half while the area required by all the capacitors is doubled, assuming each individual capacitor stays the same value. It could further be shown that higher stage count charge pumps are even worse off.

FIG. 3a is a schematic circuit diagram showing a prior art two-stage charge pump. FIG. 3b is a timing diagram of a two-phase clock signal 300 used in conjunction with the circuit shown in FIG. 3a. During phase 1 of the clock signal 300, switches 302, 304, and 306 are closed and switches 308, 310, and 312 are open, thereby coupling the positive terminal of fly capacitor Cfly1 314 to a supply voltage Vdd and its negative terminal to ground, thus charging Cfly1 314 to Vdd. During the same clock phase, the positive terminal of fly capacitor Cfly2 316 is coupled to ground and its negative terminal is coupled to a storage capacitor Cstorage1 318, thus charging the negative terminal of Cfly2 316 toward −Vdd (Cstorage1 318 having been charged toward −Vdd by Cfly1 314 on previous cycles).

During phase 2 of the clock signal 300, switches 302, 304, and 306 are open and switches 308, 310, and 312 are closed, thereby coupling the positive terminal of Cfly1 to ground and its negative terminal to Cstorage1 318, thus charging Cstorage1 318 toward −Vdd. During the same clock phase, the positive terminal of Cfly2 is coupled to storage capacitor Cstorage1 and the negative terminal of Cfly2 is coupled to a storage capacitor Cstorage2 320, thus charging Cstorage2 toward −2 Vdd. An output node Vss 322 provides the desired negative voltage "pumped" power supply, at approximately −2 Vdd.

The switches shown in FIG. 2a and FIG. 3a may be, for example, field effect transistors (FETs) selected from the many variants available, such as IGFETs, MOSFETs, and the like. The various capacitors shown in these figures may be implemented in known manner.

The method and apparatus presented below address this need for a low-noise charge pump. Various aspects of the method and apparatus described below will be seen to provide further advantages, as well, for the design and construction of charge pumps that are relatively free of noise spurs.

SUMMARY OF THE INVENTION

The invention encompasses a DC-to-DC voltage converter comprising a differential charge pump that utilizes a differential clocking scheme to reduce output electrical noise by partial cancellation of charge pump glitches (voltage transients), and a corresponding method of operating a differential charge pump.

The inventive differential charge pump circuit can be characterized as having at least two pump sections that initiate charge pumping in opposite phases of a two-phase clock signal to transfer (pump) charge to storage capacitors. A first pump section initially charges during phase 1 of the clock signal while a second pump section initially charges during phase 2 of the clock signal. In normal embodiments, the phases of the clock are preferably configured so that adjacent switches are not "ON" (conducting) at the same time; there are multiple ways known in the art to achieve such a configuration.

The result of using the differential charge pump design of the present invention is that the charging and discharging of the storage capacitors is in essence less electrically noisy, since there is a partial cancellation of charge pump glitches during the clock phases due to adding essentially an additional phase-offset charge pump.

The inventive concept can be extended to more stages and to both positive and negative charge pumps. In particular, additional stages of a similar differential design may be added to generate other voltage multiples, such as plus or minus 3 times or 4 times the supply voltage. Additional stages of a similar differential design also may be added in parallel if desired.

The switches used within the differential charge pump may be, for example, field effect transistors (FETs) selected from the many variants available, such as IGFETs, MOSFETs, and the like. The various storage and fly capacitors used within the differential charge pump may be implemented in known manner. The capacitance values of the various storage and fly capacitors is a matter of design choice for a target system, and are generally selected to fit a desired charging time or drive strength. The inventive differential charge pump is particularly well suited for implementation in integrated circuit chips requiring negative and/or positive voltages, and multiples of such voltages, based on a single input voltage.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 2b is a timing diagram of a two-phase clock signal used in conjunction with the circuit shown in FIG. 2a.

FIG. 3b is a timing diagram of a two-phase clock signal used in conjunction with the circuit shown in FIG. 3a.

FIG. 4a is an example schematic circuit diagram showing a differential two-stage charge pump in accordance with the present invention.

FIG. 4b is a timing diagram of a two-phase clock signal used in conjunction with the circuit shown in FIG. 4a.

Like reference numbers and designations in the various drawings indicate like elements.

DETAILED DESCRIPTION OF THE INVENTION

The invention encompasses a DC-to-DC voltage converter including a differential charge pump that utilizes a differential clocking scheme to reduce output electrical noise by partial cancellation of charge pump glitches (voltage transients), and a corresponding method of operating a differential charge pump.

Figures 4A, 4B:
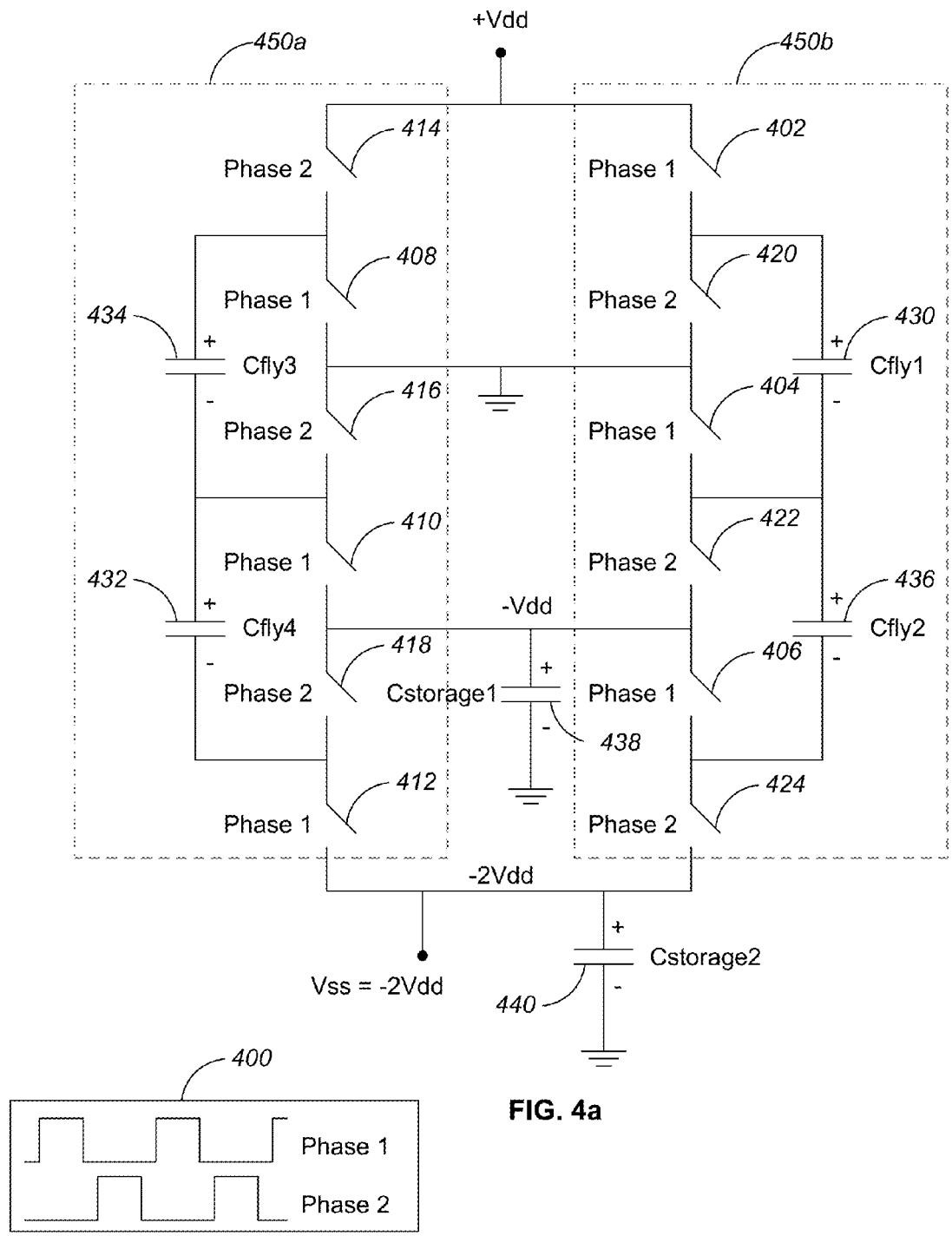

FIG. 4a is an example schematic circuit diagram showing a differential two-stage charge pump in accordance with the present invention. FIG. 4b is a timing diagram of a two-phase clock signal 400 used in conjunction with the circuit shown in FIG. 4a. In normal embodiments, the phases of the clock signal 400 are distinct and preferably configured so that adjacent switches are not "ON" (conducting) at the same time; there are multiple ways known in the art to achieve such a configuration.

During phase 1 of the clock signal 400, switches 402-412 are closed and switches 414-424 are open. Accordingly, the connections of the fly capacitors Cfly1-Clfy4 are as follows:

| Capacitor | Positive Terminal Connection | Negative Terminal Connection |
|---|---|---|
| Cfly1 | +Vdd | Ground |
| Cfly2 | Ground | Cstorage1 |
| Cfly3 | Ground | Cstorage1 |
| Cfly4 | Cstorage1 | Cstorage2/Vss |

During phase 2 of the clock signal 400, switches 402-412 are open and switches 414-424 are closed. Accordingly, the connections of the fly capacitors Cfly1-Clfy4 are as follows:

| Capacitor | Positive Terminal Connection | Negative Terminal Connection |
|---|---|---|
| Cfly1 | Ground | Cstorage1 |
| Cfly2 | Cstorage1 | Cstorage2/Vss |
| Cfly3 | +Vdd | Ground |
| Cfly4 | Ground | Cstorage1 |

In operation, during phase 1 of the clock signal 400, the fly capacitors Cfly1-Cfly4 reach the following states:

| Capacitor | State |
|---|---|
| Cfly1 | Charges to +Vdd |
| Cfly2 | Charges toward Vdd (Gnd − Vdd) by discharging Cstorage1 |
| Cfly3 | Transfers −Vdd charge to Cstorage1 and Cfly2 and Cfly4 |
| Cfly4 | Transfers −2Vdd charge to Cstorage2 by also discharging Cstorage1 |

In operation, during phase 2 of the clock signal 400, the fly capacitors Cfly1-Cfly4 reach the following states:

| Capacitor | State |
|---|---|
| Cfly3 | Charges to +Vdd |
| Cfly4 | Charges toward −Vdd (Gnd − Vdd) by discharging Cstorage1 |
| Cfly1 | Transfers −Vdd charge to Cstorage1 and Cfly2 and Cfly4 |
| Cfly2 | Transfers −2Vdd charge to Cstorage2 by also discharging Cstorage1 |

As can be seen from FIG. 4a, the inventive circuit can be characterized as having at least two pump sections 450a, 450b that initiate charge pumping in opposite phases of the clock signal 400 to transfer (pump) charge to storage capacitors (Cstorage1 438 and Cstorage2 440 in the illustrated embodiment). Thus, in the embodiment shown in FIG. 4a, Cfly3 434 in pump section 450a charges during phase 2 while its counterpart Cfly1 430 in pump section 450b charges during phase 1, and Cfly4 432 in pump section 450a transfers charge during phase 1 while its counterpart Cfly2 436 in pump section 450b transfers charge during phase 2.

The example circuit shown in FIG. 4a is a negative voltage "pumped" power supply. The inventive design applies equally well to positive voltage charge pumps. As is known in the art, achieving a particular negative voltage multiple of a positive source voltage value requires one stage to invert the initial positive voltage (i.e., a −1× charge pump), and one additional stage for each desired voltage multiple thereafter (e.g., a −2× charge pump requires two pump stages, while a −3× charge pump requires three pump stages). On the other hand, achieving a particular positive voltage multiple of a positive source voltage value requires only one stage for each desired voltage multiple because each stage is added on top of the positive source voltage (e.g., a +2× charge pump requires one pump stage, while a +3× charge pump requires two pump stages).

Figure 5A:
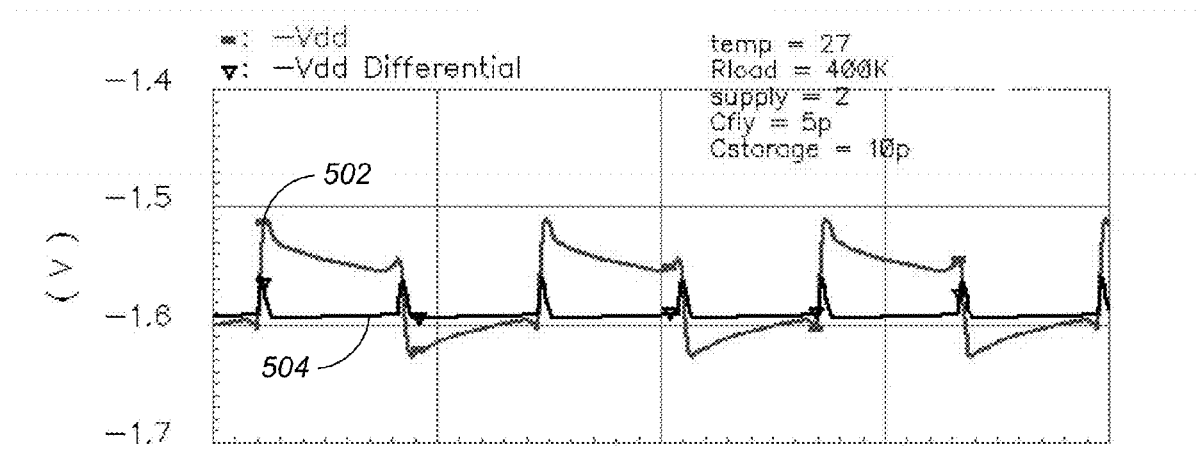
FIG. 5a is a diagram of simulated transient response waveforms versus time after one stage of charge pumping (to −Vdd) for a conventional two-stage charge pump and a two-stage differential charge pump in accordance with the present invention.
Figure 5B:
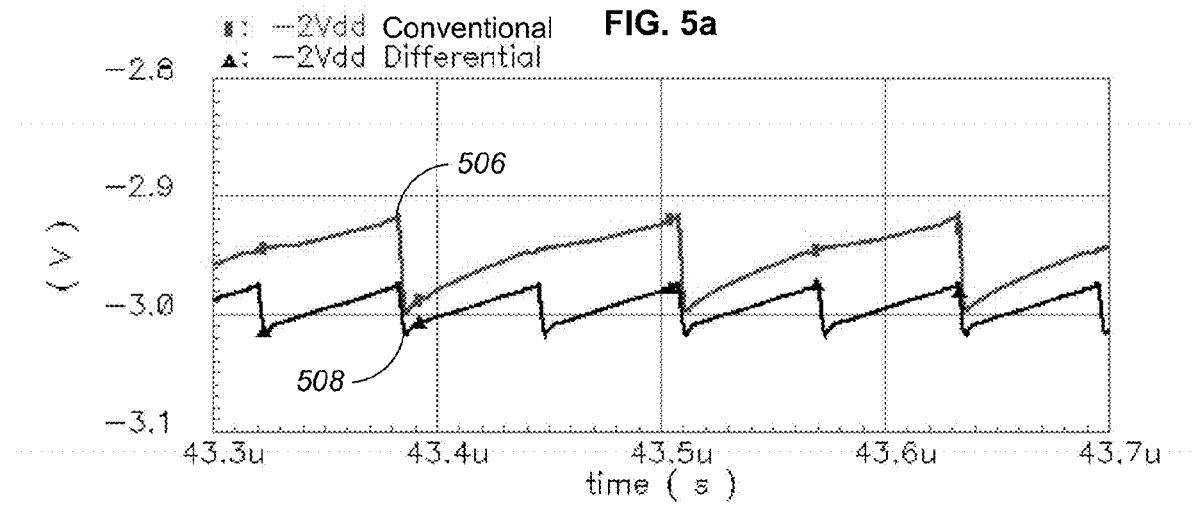
FIG. 5b is a diagram of simulated transient response waveforms versus time after two stages of charge pumping (to −2 Vdd) for a conventional two-stage charge pump and a two-stage differential charge pump in accordance with the present invention.

FIG. 5a and FIG. 5b compare the relative performance of a conventional two-stage charge pump to a two-stage differential charge pump in accordance with the present invention. For this example, the two circuits being compared utilize a 2V supply and a 400K load resistor on the final output Vss. The conventional design has two 5 pF fly caps, whereas the differential approach in accordance with the present invention utilizes four 2.5 pF fly caps, thus utilizing similar capacitor area. More particularly, FIG. 5a is a diagram of simulated transient response waveforms versus time after the first stage of charge pumping (ideally to −Vdd, assuming no load resistor) for a conventional two-stage charge pump and a two-stage differential charge pump in accordance with the present invention; FIG. 5b is a diagram of simulated transient response waveforms versus time after the second stage of charge pumping (ideally to Vss=−2 Vdd, assuming no load resistor) for a conventional two-stage charge pump and a two-stage differential charge pump in accordance with the present invention.

Referring to FIG. 5a, the waveform 502 (measured at the −Vdd node in FIG. 3a) from a conventional two-stage charge pump shows much larger transient voltage excursions and is further from the target value of −Vdd (−2V in this example) than the waveform 504 (measured at the −Vdd node in FIG. 4a) from a two-stage differential charge pump in accordance with the present invention.

Similarly, referring to FIG. 5b, the waveform 506 (measured at the Vss=−2 Vdd node in FIG. 3a) from a conventional two-stage charge pump shows much larger transient voltage excursions and is also further from the target value of −2 Vdd (−4V in this example) than does the waveform 508 (measured at the Vss=−2 Vdd node in FIG. 4a) from a two-stage differential charge pump in accordance with the present invention.

For a differential charge pump circuit in accordance with FIG. 4a using the parameters noted in FIG. 5a, there is a small increase in drive strength, as seen in FIG. 5b. That is, the "−2 Vdd Differential" waveform 508 is always lower than the "−2 Vdd Conventional" waveform 506. This is because the "−Vdd Differential" stage (shown in FIG. 5a) is more efficient, and does not require as much capacitance.

Figure 1:
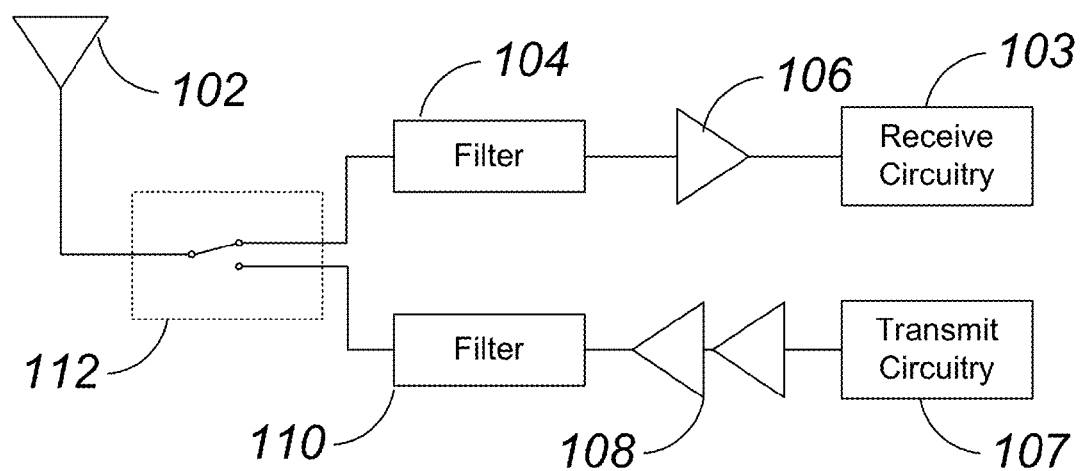
FIG. 1 is a circuit diagram of a prior art integrated circuit that switches an antenna between send and receive circuitry of a transceiver.
Figure 2A:
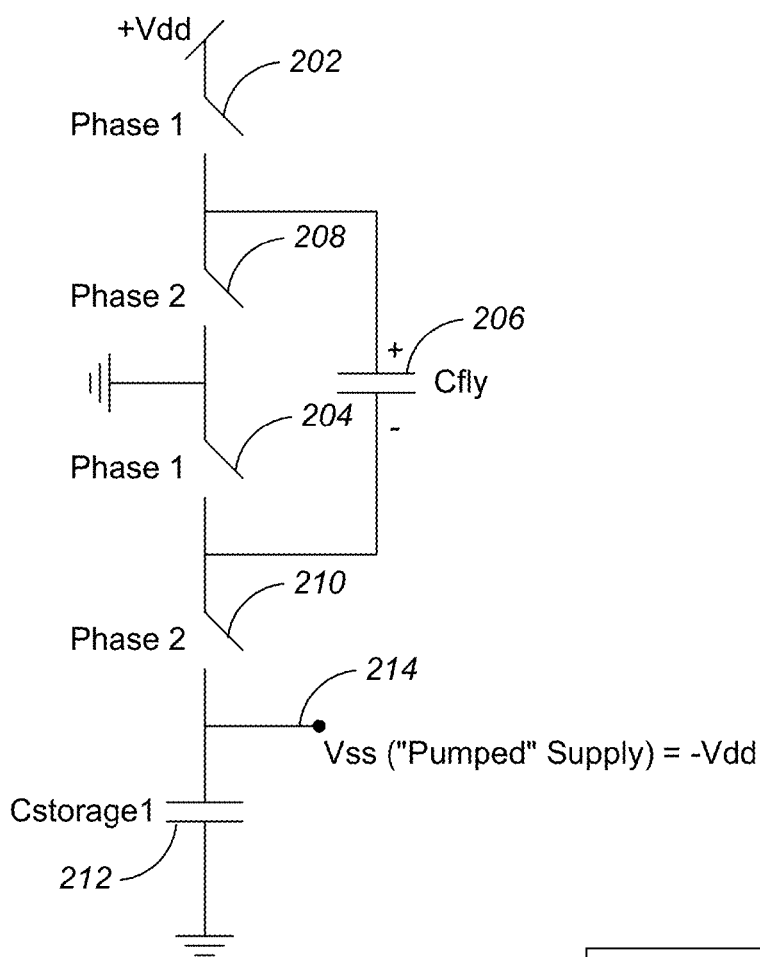
FIG. 2a is a schematic circuit diagram showing a typical prior art single-stage charge pump.
Figure 2B:
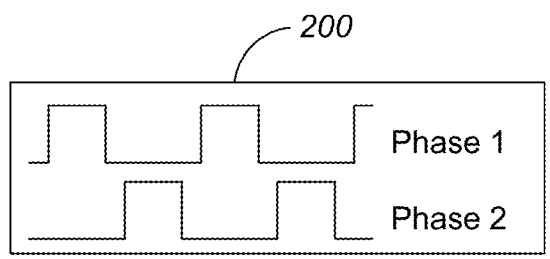
Figure 3A:
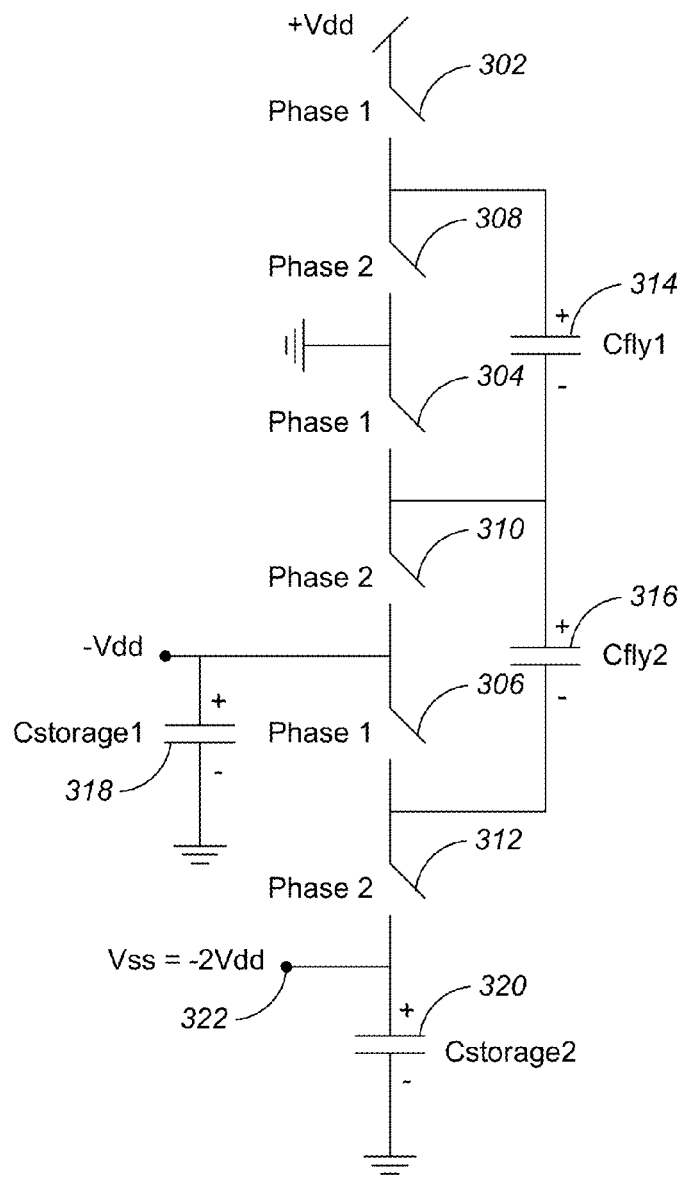
FIG. 3a is a schematic circuit diagram showing a typical prior art two-stage charge pump.
Figure 3B:
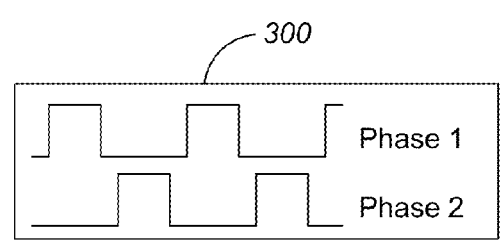

In the example of the invention used for simulating the waveforms of FIG. 5a and FIG. 5b, the four fly capacitors for the example differential charge pump circuit are half the area of the two fly capacitors used in the example two-stage prior art circuit of the type shown in FIG. 3a. Thus, the total capacitor areas are comparable between the two circuits, but the size of the storage capacitors is greatly reduced because of the differential nature of the inventive circuit. In particular, Cstorage1 438 in FIG. 4a can be very small relative to Cstorage1 318 in FIG. 3a because of the balanced nature of the differential charge pump circuit.

The result of using the differential charge pump design of the present invention is that the charging and discharging of the storage capacitors is in essence less electrically noisy, since there is a partial cancellation of charge pump glitches (voltage excursions) during the clock phases due to adding essentially an additional phase-offset two-stage charge pump.

Although a two-stage differential charge pump circuit is shown in FIG. 4a, the invention generalizes to a single stage implementation. Further, the inventive concept can be extended to more than two stages and to both positive and negative charge pumps. In particular, additional stages of a similar differential design may be added to generate other voltage multiples, such as plus or minus 3 times or 4 times the supply voltage. In practical applications, two stage and three stage differential charge pump circuits having the same or opposite polarities with respect to the input supply voltage are particularly useful. Additional stages of a similar differential design also may be added in parallel if desired, in which case it may be useful to utilize a clock signal having more than two phases.

The switches shown in FIG. 4a may be, for example, field effect transistors (FETs) selected from the many variants available, such as IGFETs, MOSFETs, and the like. However, in some circumstances it is possible to substitute a simple diode (or diode connected FET) for a switch, when the voltage and current flow requirements of the particular configuration of a specific charge pump circuit permit.

The various capacitors shown in the figures may be implemented in known manner. The capacitance values of the various storage and fly capacitors is a matter of design choice for a target system, and are generally selected to fit a desired charging time or drive strength. The inventive differential charge pump is particularly well suited for implementation in integrated circuit chips requiring negative and/or positive voltages, and multiples of such voltages, based on a single input voltage.

Another aspect of the invention includes a method for operating a charge pump in a differential configuration, including the steps of:

STEP 1: providing at least two charge pump sections electrically coupled in parallel to an input voltage source, wherein each charge pump section generates an output voltage comprising a charge-pumped multiple of an input voltage from the input voltage source;

STEP 2: providing a clock signal having at least two phases, each phase being electrically coupled to each of the at least two charge pump sections, for generating charge pumping cycles in each charge pump section;

STEP 3: initiating a charge pumping cycle in at least a first one of the charge pump sections on a first phase of the clock signal; and STEP 4: initiating a charge pumping cycle in at least a second one of the charge pump sections on a second phase of the clock signal, wherein the second phase of the clock signal is different from the first phase of the clock signal.

A skilled person will understand certain features without a need for explicit details. For example, maintaining a reasonably constant voltage on the final output generally requires a filter capacitor or the like, which is not shown in the figures. As another example, current and voltage for the output may vary depending upon many factors. The skilled person may make allowance for such factors to anticipate a voltage of the output, or may choose to regulate the voltage of the output. Such regulation is not shown, but may, for example, comprise controlling the frequency of "pump" cycles. Regulation may also comprise controlling a value of the voltage source for the charge pump.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A differential charge pump, including:
   (a) a clock signal having a first phase and a second phase, the second phase being different from the first phase, for controlling charge pumping cycles of the differential charge pump;
   (b) at least two charge pump sections electrically coupled in parallel to an input voltage source separate from the clock signal, wherein each charge pump section generates an output voltage comprising a charge-pumped multiple of an input voltage from the input voltage source, each charge pump section including at least two charge multiplying stages having an input and an output, the input of each charge multiplying stage being switchably coupled to an associated input voltage source separate from the clock signal and the output of each charge multiplying stage being switchably coupled to one of (i) an associated intermediate storage capacitor shared with at least one other of the at least two charge pump sections or (ii) a common terminal storage capacitor, each charge multiplying stage including:
   (1) a fly capacitor having an input and an output;
   (2) a first switch coupled between the input of the fly capacitor and an intermediate node, and coupled to and controlled by a selected one of the first phase or the second phase of the clock signal;
   (3) a second switch coupled between the intermediate node and the output of the fly capacitor, and coupled to and controlled by a selected one of the second phase or the first phase of the clock signal, the selected phase controlling the second switch being different from the selected phase controlling the first switch; and
   wherein the charge pumping cycle in at least a first one of the charge pump sections is initiated on the first phase of the clock signal, and the charge pumping cycle in at least a second one of the charge pump sections is initiated on the second phase of the clock signal, and
   wherein the intermediate storage capacitors are substantially smaller than corresponding intermediate storage capacitors of a non-differential charge pump outputting the same output voltage.

2. The differential charge pump of claim 1, wherein the output voltage of the charge pump is the opposite polarity with respect to the input voltage source.

3. The differential charge pump of claim 1, wherein the output voltage of the charge pump is the same polarity with respect to the input voltage source.

4. The differential charge pump of claim 1, wherein each charge pump section includes two charge multiplying stages.

5. The differential charge pump of claim 1, wherein each charge pump section includes at least three charge multiplying stages.

6. The differential charge pump of claim 1, wherein the first switch and the second switch of each charge multiplying stage are field effect transistors.

7. A differential charge pump, including:
(a) means for providing a clock signal having a first phase and a second phase, the second phase being different from the first phase, for controlling charge pumping cycles of the differential charge pump;
(b) a first means for pumping charge coupled to an input voltage source separate from means for providing the clock signal for generating an output voltage comprising a charge-pumped multiple of an input voltage from the input voltage source, the first means for pumping charge including at least two charge multiplying stages having an input and an output, the input of each charge multiplying stage being switchably coupled to an associated input voltage source separate from the clock signal and the output of each charge multiplying stage being switchably coupled to one of (i) an associated intermediate storage capacitor or (ii) a common terminal storage capacitor, each charge multiplying stage including:
(1) a fly capacitor having an input and an output;
(2) a first switch coupled between the input of the fly capacitor and an intermediate node, and coupled to and controlled by a selected one of the first phase or the second phase of the clock signal;
(3) a second switch coupled between the intermediate node and the output of the fly capacitor, and coupled to and controlled by a selected one of the second phase or the first phase of the clock signal, the selected phase controlling the second switch being different from the selected phase controlling the first switch;
(c) a second means for pumping charge electrically coupled to the input voltage source for generating an output voltage comprising a charge-pumped multiple of an input voltage from the input voltage source, and electrically coupled in parallel to the first means for pumping charge, the second means for pumping charge including at least two charge multiplying stages having an input and an output, the input of each charge multiplying stage being switchably coupled to an associated input voltage source separate from the clock signal and the output of each charge multiplying stage being switchably coupled to one of (i) an associated intermediate storage capacitor shared with a corresponding one of the charge multiplying stages of the first means for pumping charge or (ii) a common terminal storage capacitor, each charge multiplying stage including:
(1) a fly capacitor having an input and an output;
(2) a first switch coupled between the input of the fly capacitor and an intermediate node, and coupled to and controlled by a selected one of the first phase or the second phase of the clock signal;
(3) a second switch coupled between the intermediate node and the output of the fly capacitor, and coupled to and controlled by a selected one of the second phase or the first phase of the clock signal, the selected phase controlling the second switch being different from the selected phase controlling the first switch;
(d) means for initiating a charge pumping cycle in the first means for pumping charge on the first phase of the clock signal; and
(e) means for initiating a charge pumping cycle in the second means for pumping charge on the second phase of the clock signal;
wherein the intermediate storage capacitors are substantially smaller than corresponding intermediate storage capacitors of a non-differential charge pump outputting the same output voltage.

8. The differential charge pump of claim 7, wherein the output voltage of the charge pump is the opposite polarity with respect to the input voltage source.

9. The differential charge pump of claim 7, wherein the output voltage of the charge pump is the same polarity with respect to the input voltage source.

10. The differential charge pump of claim 7, wherein the first means for pumping charge and the second means for pumping charge each include two charge multiplying stages.

11. The differential charge pump of claim 7, wherein the first means for pumping charge and the second means for pumping charge each include at least three charge multiplying stages.

12. The differential charge pump of claim 7, wherein the first switch and the second switch of each charge multiplying stage are field effect transistors.

13. A method for operating a charge pump, including the steps of:
(a) providing a clock signal having a first phase and a second phase, the second phase being different from the first phase, for controlling charge pumping cycles of the charge pump;
(b) providing at least two charge pump sections electrically coupled in parallel to an input voltage source separate from the clock signal, wherein each charge pump section generates an output voltage comprising a charge-pumped multiple of an input voltage from the input voltage source, each charge pump section including at least two charge multiplying stages having an input and an output, the input of each charge multiplying stage being switchably coupled to an associated input voltage source separate from the clock signal and the output of each charge multiplying stage being switchably coupled to one of an associated intermediate storage capacitor shared with at least one other of the at least two charge pump sections or a common terminal storage capacitor, each charge multiplying stage including:
(1) a fly capacitor having an input and an output;
(2) a first switch coupled between the input of the fly capacitor and an intermediate node, and coupled to and controlled by a selected one of the first phase or the second phase of the clock signal;
(3) a second switch coupled between the intermediate node and the output of the fly capacitor, and coupled to and controlled by a selected one of the second phase or the first phase of the clock signal, the selected phase controlling the second switch being different from the selected phase controlling the first switch;
(c) initiating a charge pumping cycle in at least a first one of the charge pump sections on the first phase of the clock signal; and
(d) initiating a charge pumping cycle in at least a second one of the charge pump sections on the second phase of the clock signal;

wherein the intermediate storage capacitors are substantially smaller than corresponding intermediate storage capacitors of a non-differential charge pump outputting the same output voltage.

14. The method of claim 13, wherein the output voltage of the charge pump is the opposite polarity with respect to the input voltage source.

15. The method of claim 13, wherein the output voltage of the charge pump is the same polarity with respect to the input voltage source.

16. The method of claim 13, wherein each charge pump section includes two charge multiplying stages.

17. The method of claim 13, wherein each charge pump section includes at least three charge multiplying stages.

18. The method of claim 13, wherein the first switch and the second switch of each charge multiplying stage are field effect transistors.

19. A differential charge pump, including:
(a) a clock signal having a first phase and a second phase non-overlapping the first phase, for controlling charge pumping cycles of the differential charge pump; and
(b) at least two charge pump sections electrically coupled in parallel to an input voltage source separate from the clock signal, wherein each charge pump section generates an output voltage comprising a charge-pumped multiple of an input voltage from the input voltage source, each charge pump section including at least two charge multiplying stages having an input and an output, the input of each charge multiplying stage being switchably coupled to an associated input voltage source separate from the clock signal and the output of each charge multiplying stage being switchably coupled to one of an associated intermediate storage capacitor shared with at least one other of the at least two charge pump sections or a common terminal storage capacitor, each charge multiplying stage including:
(1) a fly capacitor having an input and an output;
(2) a first switch coupled between the input of the fly capacitor and an intermediate node, and coupled to and controlled by the first phase of the clock signal;
(3) a second switch coupled between the intermediate node and the output of the fly capacitor, and coupled to and controlled by the second phase of the clock signal;
wherein the charge pumping cycle in at least a first one of the charge pump sections is initiated on the first phase of the clock signal, and the charge pumping cycle in at least a second one of the charge pump sections is initiated on the second phase of the clock signal, and
wherein the intermediate storage capacitors are substantially smaller than corresponding intermediate storage capacitors of a non-differential charge pump outputting the same output voltage.

20. The differential charge pump of claim 19, wherein the output voltage of the charge pump is the opposite polarity with respect to the input voltage source.

21. The differential charge pump of claim 19, wherein the output voltage of the charge pump is the same polarity with respect to the input voltage source.

22. The differential charge pump of claim 19, wherein each charge pump section includes more than two charge multiplying stages.

23. The differential charge pump of claim 19, wherein each charge pump section includes at least three charge multiplying stages.

24. The differential charge pump of claim 19, wherein the first switch and the second switch of each charge multiplying stage are field effect transistors.

* * * * *